United States Patent [19]

Rahilly

[11] 4,427,841

[45] Jan. 24, 1984

[54] BACK BARRIER HETEROFACE AlGAAS SOLAR CELL

[75] Inventor: W. Patrick Rahilly, Spring Valley, Ohio

[73] Assignee: The United States of America as represented by the Secretary of the Air Force, Washington, D.C.

[21] Appl. No.: 393,268

[22] Filed: Jun. 29, 1982

[51] Int. Cl.³ .................. H01L 31/06; H01L 31/18
[52] U.S. Cl. .................... 136/255; 136/262; 148/186; 357/30
[58] Field of Search .............. 136/262, 255; 357/30; 148/171, 177, 186

[56] References Cited

U.S. PATENT DOCUMENTS

| | | | |
|---|---|---|---|
| 3,990,101 | 11/1976 | Ettenberg et al. | 136/255 |
| 4,053,918 | 10/1977 | Fletcher et al. | 136/255 |
| 4,070,205 | 1/1978 | Rahilly | 136/255 |
| 4,126,930 | 11/1978 | Moon | 29/572 |
| 4,179,702 | 12/1979 | Lamorte | 357/30 |
| 4,191,593 | 3/1980 | Cacheux | 136/259 |

Primary Examiner—Aaron Weisstuch
Attorney, Agent, or Firm—Donald J. Singer; Bernard E. Franz

[57] ABSTRACT

This is an improvement to the AlGaAs/GaAs heteroface solar cell in that the photovoltaically active region is composed of AlGaAs of low Al composition (approximately 2% to 10%) and is bounded by the usual high Al content (approximately 90% or more) AlGaAs window on the cell top and a novel high Al content (more than about 90%) back barrier. The back barrier serves to significantly reduce minority carrier losses in the rear region by blocking the carriers from reaching the cell substrate region. The result is that both light generated current and cell voltage performance will be improved.

4 Claims, 2 Drawing Figures

BACK BARRIER HETEROFACE ALGAAS SOLAR CELL

RIGHTS OF THE GOVERNMENT

The invention described herein may be manufactured and used by or for the Government of the United States for all governmental purposes without the payment of any royalty.

BACKGROUND OF THE INVENTION

This invention relates generally to semiconductor devices having material layers composed of AlGaAs of varying AlAs compositions and is related to manufacturing processes and particularly to photovoltaic cells and the fabrication thereof.

Many types of devices have been fabricated using various mixes of AlAs and GaAs; laser diodes has been one dominant application. AlGaAs/GaAs heteroface solar cells is another use of these semiconductor materials. There is considerable information about developments using these semiconductor materials that can be found in various publications such as the Journal of Solid State Electronics, Journal of Electron Devices and the text book "Physics of Semiconductor Devices", by Simon Sze, published by Wiley Interscience.

Efforts in the solar cell technology include, among other things, attempts to increase the solar cell conversion efficiency by better matching the semiconductor bandgap to the solar spectrum. These efforts include both single junction and cascaded junction solar cells. The single junction approach includes the AlGaAs/GaAs heteroface cell wherein the photovoltaic activity occurs in the GaAs part of the device which contains the P/N junction; the AlGaAs material is used in this particular structure to serve as a wide bandgap barrier which is optically transparent. The cascaded structures utilize an electrically series connected double cell stack each composed of a different combination of III-V semiconductor materials. Also, cascaded structures have been made nonmonolithic and spectral splitting is employed to place the appropriate portions of the solar spectrum on the appropriate cells. Various descriptions of these approaches are provided in U.S. Pat. No. 4,017,332 to James, U.S. Pat. No. 4,191,292 to Cacheux, U.S. Pat. No. 4,179,702 to Lamorte, U.S. Pat. No. 4,070,205 to Rahilly, U.S. Pat. No. 3,990,101 to Ettenberg et al and an interesting Schottky barrier approach taught in U.S. Pat. No. 4,053,918 to Fletcher et al. A Vander Plas et al article on "Operation of Multi-Bandgap Concentrator Cells with a Spectrum Splitting Filter" in Proceedings, 2nd European Community Photovoltaic Solar Energy Conference, Berlin, Apr. 23–26, 1979, Reidel Publishing Co. (1979) discloses solar cells composed of $Al_xGa_{1-x}As$ where x is 0.98.

U.S. Pat. No. 4,126,930 by Moon relates to fabrication of AlGaAs/GaAs heteroface solar cells involving magnesium diffusion during liquid phase epitaxial growth of a magnesium dipped AlGaAs layer on an underlying N-type GaAs layer which produces a thin layer of Mg-doped P-type GaAs and subsequent P/N photovoltaic junctions in the GaAs material.

SUMMARY OF THE INVENTION

An object of the invention is to provide for a higher conversion efficiency single junction solar cell yet keeping the processing simplified as in the case of the AlGaAs/GaAs heteroface cell.

According to the invention, using liquid phase or vapor phase epitaxy a layer of N-type AlGaAs with wide bandgap is grown on a suitable N-type GaAs surface. This growth is followed by a narrower gap N-AlGaAs layer (matched to the solar spectrum), followed by a wide gap P-type AlGaAs layer doped with Mg, Sn, Ge, or Be which diffuses into the N-type AlGaAs layer below to form the photovoltaically active P/N junction region. The appropriate electrical contacts are added along with an antireflection coating to complete the device.

The invention structure results in both front and back barriers bounding the active region where the active region is optimally matched to the solar spectrum. This structure will enhance the collection of light generated carriers thereby increasing the light generated current. The wider bandgap material will reduce the value of the dark current.

DETAILED DESCRIPTION

Figure 2:
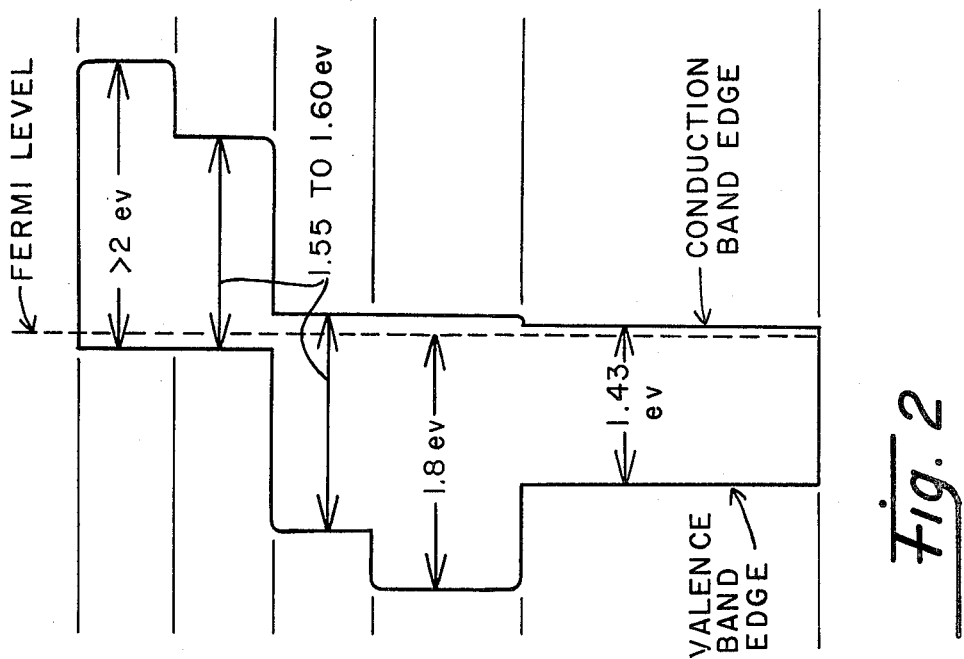
FIG. 2 is an energy based diagram corresponding to the structure of FIG. 1.
Figure 1:
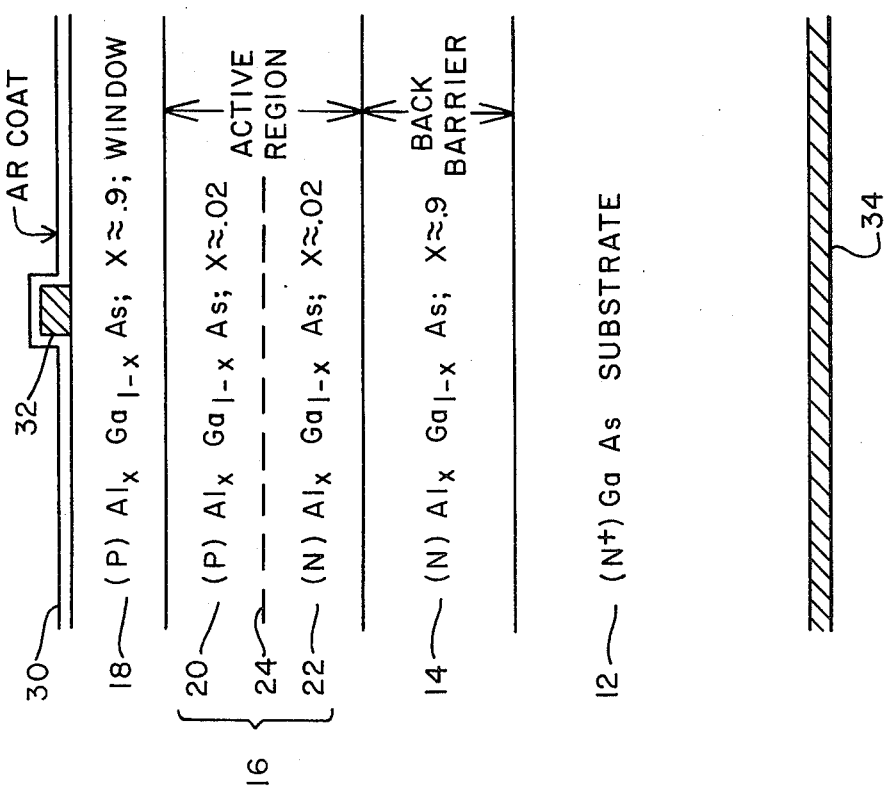
FIG. 1 is a cross-sectional schematic of the invention structure with approximate values given for the semiconductor material proportions and approximate physical dimensions.

The presently preferred embodiment of the invention is illustrated in FIGS. 1 and 2. The device is useful for direct conversion of light to electricity with useful application to space power systems. The structure can be made using liquid or vapor phase epitaxial growth and can be constructed to possess P on N or N on P polarity.

FIG. 1 is a schematic of the back barrier AlGaAs heteroface solar cell's cross section showing semiconductor material composition and conductivity (N or P). FIG. 2 is the corresponding band diagram showing the relationship of minority carrier confinement of bandgap of the various materials.

In the back region 14 of the solar cell shown in FIG. 1, the Al to Ga ratio of the AlGaAs is made approximately 9:1, which corresponds to a bandgap of greater than 2 electron volts. Since the valence band edge shift from the active region to the barrier region is more than 3 kT, the minority carriers (holes) are blocked from being lost to the GaAs substrate region. The barrier region is made sufficiently thick (one to 5 microns) so as to prevent tunneling. Since the holes are prevented from transport to the GaAs substrate, their probability of reaching the P/N junction is significantly enhanced. The result is that the cell will have improved current generation and increased voltage performance, thereby raising the conversion efficiency. The use of $Al_xGa_{1-x}As$ material with x approximately 0.02 to 0.1 for the active region 16 provides for a better match to the solar spectrum of interest (terrestrial and space sunlight).

The starting point for fabrication of the device of FIG. 1 is a single crystal GaAs wafer 12 of N+ conductivity. The wafer is given suitable surface polish and etch treatments in preparation for the next step. The wafer is then placed in a melt of N-type $Al_xGa_{1-x}As$ where x≈0.9 and a layer 14 is grown. This step incorporates the usual liquid phase epitaxial growth procedures as will be used throughout this description. The resultant growth is then prepared for the next material growth. The prepared wafer is then placed into a second melt containing N-type $Al_xGa_{1-x}As$ material where x is preferably about 0.02, and may have a value up to approximately 0.1. Once the growth of the narrower bandgap material of region 16 is accomplished, the wafer is removed from the second melt and prepared for the third and final semiconductor material growth. The wafer is placed in the third melt containing P-type $Al_xGa_{1-x}As$ material with $x \simeq 0.9$ and containing a P-dopant such as Be, Mg, Zn or Ge. As the third and final layer 18 grows, the selected P-dopant diffuses into the AlGaAs layer 20 immediately below, thereby converting it from N to P-type, leaving an N-type layer 22, with the formation of a P/N junction 24 in the resulting $x \simeq 0.02$ AlGaAs material of active region 16. After removal of the wafer from the third melt, conventional contacts are applied; the top is done in grid fashion to form front contact 32, and the bottom is covered totally to form back contact 34. The top contact 32 is composed of a Au-Zn flash cost followed by a thicker layer of Ag. The bottom contact 34 is composed of the same materials. The wafer is then sintered in the usual way to accomplish ohmicity of the contacts. An anti-reflection coating 30 such as $Ta_2O_5$ is then deposited on the cell top to accomplish efficient coupling of light into the device.

The aforementioned growths thicknesses, selection of P dopants and selection of values for composition parameters are done in accordance with a predetermined recipe dictated by the time and temperatures selected for optimal conditions for material growth and final device performance.

ALTERNATIVE EMBODIMENTS

The invention can be N or P type also. For the latter, the fabrication would begin with a P type GaAs wafer in lieu of the N-type one. The device also can be constructed using vapor phase epitaxy which is discussed clearly in the available literature on the subject.

Thus, while preferred constructional features of the invention are embodied in the structure illustrated herein, it is to be understood that changes and variations may be made by the skilled in the art without departing from the spirit and scope of my invention.

I claim:

1. A solar cell comprising an active region of aluminum gallium arsenide between window and back barrier layers of larger but approximately equal bandgap of aluminum gallium arsenide, with the back barrier layer formed on a substrate of gallium arsenide, wherein the active region has a relatively low proportion of aluminum to gallium and is divided into a layer of one conductivity type and a layer of the opposite conductivity type which form a P-N junction, and wherein the back barrier layer has a relatively high proportion of aluminum to gallium and is sufficiently thick so as to prevent tunneling.

2. A solar cell according to claim 1, wherein the aluminum gallium arsenide has the formula $Al_xGa_{1-x}As$, with x equal to approximately 0.9 in said window and back barrier layers, and with x in the range of approximately 0.02 to approximately 0.1 in said active region.

3. A solar cell according to claim 1, wherein the GaAs substrate is of N+ conductivity, the back barrier layer and the adjacent layer of the active region are of N conductivity, and the window layer and adjacent layer of the active region are of P conductivity; wherein there is a grid contact on the window, with the window and grid contact covered by an antireflective coating, and wherein a back contact covers the back surface of the substrate.

4. The method of forming a solar cell on a wafer of a single crystal gallium arsenide substrate having a given type conductivity, comprising the steps of:
   a. forming on said substrate a back barrier layer of aluminum gallium arsenide having said given type conductivity, with a relatively high proportion of aluminum to gallium to provide a high bandgap energy, and of sufficient thickness to prevent tunneling;
   b. forming on said back barrier layer an active region of aluminum gallium arsenide of said given conductivity type, with a relatively low proportion of aluminum to gallium; and
   c. forming on said active region a window layer of aluminum gallium arsenide of approximately the same composition as said back barrier layer and containing a dopant to provide the opposite conductivity type with respect to said given type, the dopant diffusing into the upper portion of said active region to convert the conductivity thereof to the opposite type, leaving the lower portion of in the active region in the given conductivity type, to thereby form a P-N junction.

* * * * *

UNITED STATES PATENT AND TRADEMARK OFFICE
CERTIFICATE OF CORRECTION

PATENT NO. : 4,427,841

DATED : January 24, 1984

INVENTOR(S) : W. Patrick Rahilly

It is certified that error appears in the above-identified patent and that said Letters Patent is hereby corrected as shown below:

Col 3, line 21, change "cost" to ---coat---.

line 36, change "or" to ---on---.

Claim 4, line 21, delete "in".

Signed and Sealed this

Twenty-second Day of May 1984

[SEAL]

Attest:

GERALD J. MOSSINGHOFF

Attesting Officer

Commissioner of Patents and Trademarks